(12) United States Patent
Ishiwaki

(10) Patent No.: US 6,725,415 B2
(45) Date of Patent: Apr. 20, 2004

(54) ARITHMETIC UNIT PERFORMING CYCLIC REDUNDANCY CHECK AT HIGH SPEED

(75) Inventor: Masahiko Ishiwaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 468 days.

(21) Appl. No.: 09/769,413

(22) Filed: Jan. 26, 2001

(65) Prior Publication Data

US 2001/0020288 A1 Sep. 6, 2001

(30) Foreign Application Priority Data

Mar. 6, 2000 (JP) .................................. 2000-060330

(51) Int. Cl.[7] .................. H03M 13/09; G06F 7/52; G06F 7/72
(52) U.S. Cl. ......................... 714/781; 708/492
(58) Field of Search ................ 714/781–785; 708/492

(56) References Cited

U.S. PATENT DOCUMENTS 5,502,665 A * 3/1996 Im ........................... 708/492
5,768,168 A * 6/1998 Im ........................... 708/492

FOREIGN PATENT DOCUMENTS

| JP | 63-128819 | | 6/1988 | |
|---|---|---|---|---|
| JP | 63318819 A | * | 12/1988 | .......... H03M/13/00 |
| JP | 6-70032 | | 9/1994 | |

OTHER PUBLICATIONS

Monteiro, F. et al. A Fast CRC implementation on FPGA Using a Pipelined Architecture for the Polynomial Division; Electronics, Circuits and Systems, 2001. The 8th IEEE International Conference on; vol.: 3, Sep. 2–5, 2001 pp. 1231–1234 vol. 3.*

Albertengo, G.; Sisto, R.; Parallel CRC generation; Micro, IEEE , vol.: 10 Issue: 5 , Oct. 1990 pp. 63–71.*

* cited by examiner

Primary Examiner—R. Stephen Dildine
(74) Attorney, Agent, or Firm—McDermott, Will & Emery

(57) ABSTRACT

A hold circuit holds results of processing in an arithmetic circuit collectively receiving four bits from inputs. The inventive arithmetic unit collectively processes an input data string, which has generally been processed bit by bit, by four bits at a time, whereby a CRC arithmetic operation can be speeded up. More preferably, the arithmetic unit can flexibly deal with change of a generating polynominal set in the arithmetic circuit when rendering set data corresponding to the generating polynomial changeable.

9 Claims, 19 Drawing Sheets

FIG.7 CLOCK CYCLE T3

ARITHMETIC UNIT PERFORMING CYCLIC REDUNDANCY CHECK AT HIGH SPEED

BACKGROUND OF THE INVENTION

1. Field of the Invention

The present invention relates to a CRC arithmetic unit for detecting a data transmission error by a CRC (cyclic redundancy check) system employed for transmitting a data string.

2. Description of the Background Art

In relation to communication of a data string, there is a method of determining whether or not the transmitted data string is normal by adding a check bit for an error detection check to an information bit to be transmitted and performing a prescribed operation in receiving. A method employing a parity bit is well known as a simple error detection system. In this method, a single parity bit is added in response to whether the number of "1" included in each transmitted data string is even or odd.

A cyclic redundancy check (hereinafter abbreviated as CRC) is a method enhanced in detectability. In the CRC, an operation with a generating polynomial is performed on an information bit to be transmitted.

A method of forming a CRC sign is briefly described. First, it is assumed that P(X) represents an information data string to be transmitted corresponding to an information bit, G(X) represents a generating polynomial, F(X) represents a transmitted data string and R(X) represents a remainder polynomial corresponding to a check bit. These are expressed in sign polynomials. In a sign polynomial, a binary number is expressed in a polynomial. For example, P(X)="100 1011 0100 1011" is expressed as follows:

$$P(X)=X^{14}+X^{11}+X^9+X^8+X^6+X^3+X^1+1$$

When the generating polynomial G(X) is equal to $X^8+X^7+X^6+X^4+X^2+1$, the transmitted data string F(X) is obtained by the following expressions (1) to (3):

First, the information data string P(X) is multiplied by the high-order term $X^8$ of the generating polynomial G(X) for obtaining P'(X) as follows:

$$P'(X)=P(X)\times X^8 \qquad (1)$$

Then, P'(X) is subjected to mod2 division described later by the generating polynomial G(X) for obtaining the remainder polynomial R(X). It is assumed that "/" denotes the mod2 division described later.

$$R(X)=P'(X)/G(X) \qquad (2)$$

The obtained remainder polynomial R(X) is added to P'(X) for obtaining the transmitted data string F(X) as follows:

$$F(X)=P'(X)+R(X) \qquad (3)$$

FIG. 15 is a diagram for illustrating the mod2 division for obtaining the check bit from the information bit and the generating polynomial.

The operation of obtaining the check bit from the information bit when the generating polynomial G(X) is equal to $X^8+X^7+X^6+X^4+X^2+1$ is described with reference to FIG. 15. "1 1101 0101" corresponds to the generating polynomial, and the information bit is "100 1011 0100 1011".

The number 0 of a bit number−1 in the generating polynomial is first added to the low order of the information bit. This processing corresponds to the operation shown in the expression (2).

The mod2 operation is performed on each bit of the generating polynomial in descending order. However, the mod2 operation generates no carry or negative carry dissimilarly to general division. In other words, the exclusive OR of each information bit and each bit of the generating polynominal is sequentially calculated. The most significant result is necessarily "0" and hence at least a single information bit is supplied to the lower result to match with the bit number of the generating polynomial. Referring to FIG. 15, symbol A denotes an intermediate result obtained in this stage.

The mod2 operation is thereafter similarly repeated, and terminated when the result is finally less than the bit number of the generating polynomial. The finally obtained remainder "00110001" is the obtained check bit. The operation of repeating the mod2 operation for obtaining the remainder is referred to as mod2 division in this specification.

The check bit obtained in the aforementioned manner is transmitted subsequently to the information bit when transmitting the data string. The receiving end confirms whether or not a transmission error occurs on the basis of the transmitted information and check bits.

FIG. 16 is a diagram for illustrating the operation for confirming whether or not a transmission error occurs.

Referring to FIG. 16, the mod2 division is performed on the data string transmitted with the check bit "0011 0001" added to the lower side of the information bit "100 1011 0100 1011" by the generating polynomial "1 1101 0101". As to the mod2 division described with reference to FIG. 15, redundant description is not repeated.

When transmission is correctly performed, the remainder is zero and it is confirmable that no transmission error occurs.

FIG. 17 is a conceptual diagram showing the structure of a conventional CRC arithmetic unit 100 performing the division illustrated in FIGS. 15 and 16.

Referring to FIG. 17, the CRC arithmetic unit 100 includes XOR circuits 102 to 110 operating and outputting exclusive OR and registers 112 to 126 driven by a clock signal (not shown) for capturing and holding data.

The XOR circuit 102 operates and outputs the exclusive OR of a data string input in the CRC arithmetic unit 100 and a value held in the register 126. The register 112 receives the output of the XOR circuit 102 and holds the same for a single clock period. The register 114 receives an output of the register 112 and holds the same for a single clock period. The XOR circuit 104 operates and outputs the exclusive OR of outputs of the registers 114 and 126. The register 116 receives the output of the XOR circuit 104 and holds the same for a single clock period. The register 118 receives an output of the register 116 and holds the same for a single clock period.

The XOR circuit 106 operates and outputs the exclusive OR of the outputs from the registers 118 and 126. The register 120 receives the output of the XOR circuit 106 and holds the same for a single clock period. The register 122 receives an output of the register 120 and holds the same for a single clock period. The XOR circuit 108 operates and outputs the exclusive OR of outputs from the registers 122 and 126. The register 124 receives the output of the XOR circuit 108 and holds the same for a single clock period. The XOR circuit 110 outputs the exclusive OR of outputs from the registers 124 and 126. The register 126 receives the output of the XOR circuit 110 and holds the same for a single clock period.

FIGS. 18 to 25 illustrate the process of operations in the CRC arithmetic unit 100 shown in FIG. 17. The process up to the intermediate stage of the mod2 division shown in FIG. 15 is described with reference to FIGS. 18 to 25.

Referring to FIGS. 15 and 18, the CRC arithmetic unit 100 is provided with the XOR circuits 102 to 110 in correspondence to positions where the bits of "1" of the generating polynomial are present. In other words, the structure of the CRC arithmetic unit 100 corresponds to the generating polynomial "1 1101 0101".

First, it is assumed that all registers 112 to 126 initially hold "0". Although not illustrated, it is general that values held in all registers 112 to 126 are initialized to "0" in response to a reset signal. While the register 126 holds "0", the XOR circuits 102 to 110 output data received from preceding stages to subsequent stages intact. In other words, the CRC arithmetic unit 100 acts as a simple shift register until data "1" arrives at the register 126.

After a lapse of a prescribed time, the registers 112 to 126 hold "1001 0110". "1" is input in an input of the CRC arithmetic unit 100.

Referring to FIG. 19, the registers 112 to 126 hold results operated in the XOR circuits 102 to 110 after a lapse of a single clock period. The next bit "0" is input in the input of the CRC arithmetic unit 100. This state corresponds to the intermediate result A shown in FIG. 15.

FIG. 20 shows the state in a next clock cycle. At this time, the registers 112 to 126 hold "0010 0101".

FIG. 21 shows the state in a next clock cycle. At this time, the register 126 holds "0" and hence the values are shifted to the upper side one bit position. Thus, the registers 122 to 126 hold "0100 1010".

FIG. 22 shows the state in a next clock cycle. The register 126 holds "0" in FIG. 21, and hence the CRC arithmetic unit 100 holds "1001 0101" shifted to the upper side one bit position. "0" is newly input in the input of the CRC arithmetic unit 100. This state corresponds to an intermediate result B shown in FIG. 15.

In a next clock cycle, the registers 112 to 126 hold "1111 1111" as shown in FIG. 23. "1" is newly input in the input of the CRC arithmetic unit 100. This state corresponds to an intermediate result C shown in FIG. 15. In a next clock cycle, the registers 112 to 126 hold "0010 1010" as shown in FIG. 24.

In a next clock cycle, the registers 112 to 126 hold "0101 0101" as shown in FIG. 25. In a next clock cycle, the registers 112 to 126 hold an intermediate result D shown in FIG. 15.

A plurality of systems employing different generating polynomials are present for the CRC operation. In the conventional CRC arithmetic unit 100 described above, the positions for inserting the XOR circuits 102 to 110 must be changed for changing the used generating polynomial, while it is difficult to change the positions when the generating polynomial is once decided.

Further, the conventional arithmetic unit 100 can handle only a 1-bit input in a single clock cycle, to disadvantageously result in a long operation time.

SUMMARY OF THE INVENTION

An object of the present invention is to provide a CRC arithmetic unit capable of readily dealing with change of a generating polynomial and performing an operation at a high speed.

Briefly stated, the present invention is directed to a CRC arithmetic unit for performing error detection in a cyclic redundancy check system on object data on the basis of a generating polynomial, which comprises a main arithmetic circuit and a hold circuit.

The main arithmetic circuit sequentially receives a plurality of split data obtained by splitting signal bits included in the object data into a plurality of bits for performing arithmetic processing according to the generating polynomial. The main arithmetic circuit performs the arithmetic processing on first data included in the plurality of split data and second data obtained by performing the arithmetic processing on part of the object data received before receiving the first data and generating third data.

The hold circuit holds the second data and supplies the same to the main arithmetic circuit while holding the third data.

Accordingly, a principal advantage of the present invention resides in that the CRC arithmetic unit simultaneously batch-processing a plurality of bits in a clock cycle can perform a CRC operation at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
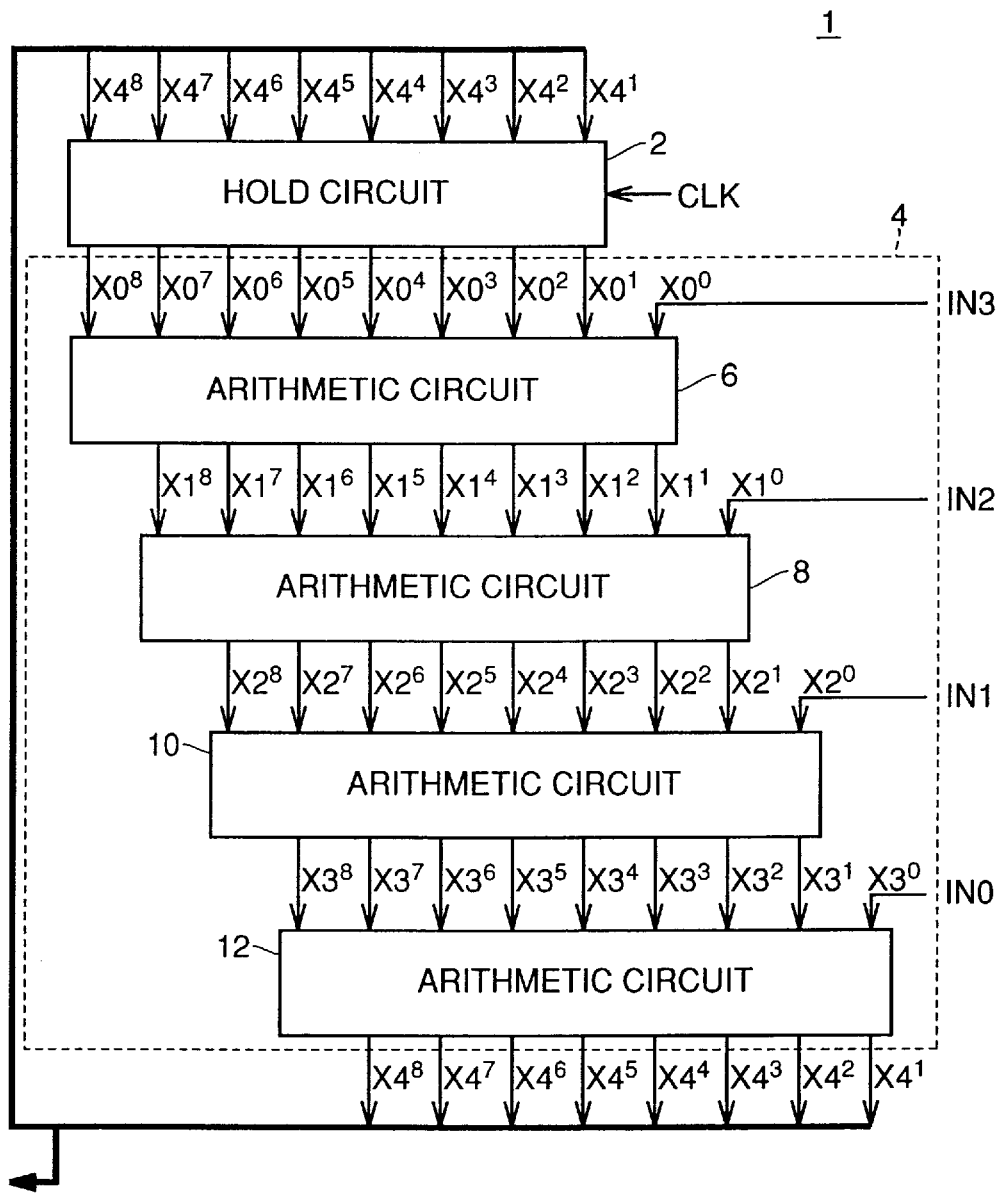
FIG. 1 is a schematic block diagram showing the structure of a CRC arithmetic unit 1 according to a first embodiment of the present invention.

Embodiments of the present invention are now described in detail with reference to the drawings. In the drawings, parts identical or corresponding to each other are denoted by the same reference numerals.

[First Embodiment]

FIG. 1 is a schematic block diagram showing the structure of a CRC arithmetic unit 1 according to a first embodiment of the present invention.

Referring to FIG. 1, the CRC arithmetic unit 1 includes a hold circuit 2 capturing data $X4^1$ to $X4^8$ in response to a clock signal CLK and an arithmetic circuit 4 receiving data $X0^1$ to $X0^8$ held by the hold circuit 2 and data $X3^0$ to $X0^0$ input from inputs IN0 to IN3 and outputting data $X4^1$ to $X4^8$.

The arithmetic circuit 4 includes an arithmetic circuit 6 receiving the data $X0^0$ to $X0^8$ and outputting data $X1^1$ to $X1^8$, an arithmetic circuit 8 receiving the data $X1^0$ to $X1^8$ and outputting data $X2^1$ to $X2^8$, an arithmetic circuit 10 receiving the data $X2^0$ to $X2^8$ and outputting data $X3^1$ to $X3^8$ and an arithmetic circuit 12 receiving the data $X3^0$ to $X3^8$ and outputting the data $X4^1$ to $X4^8$.

Figure 2:
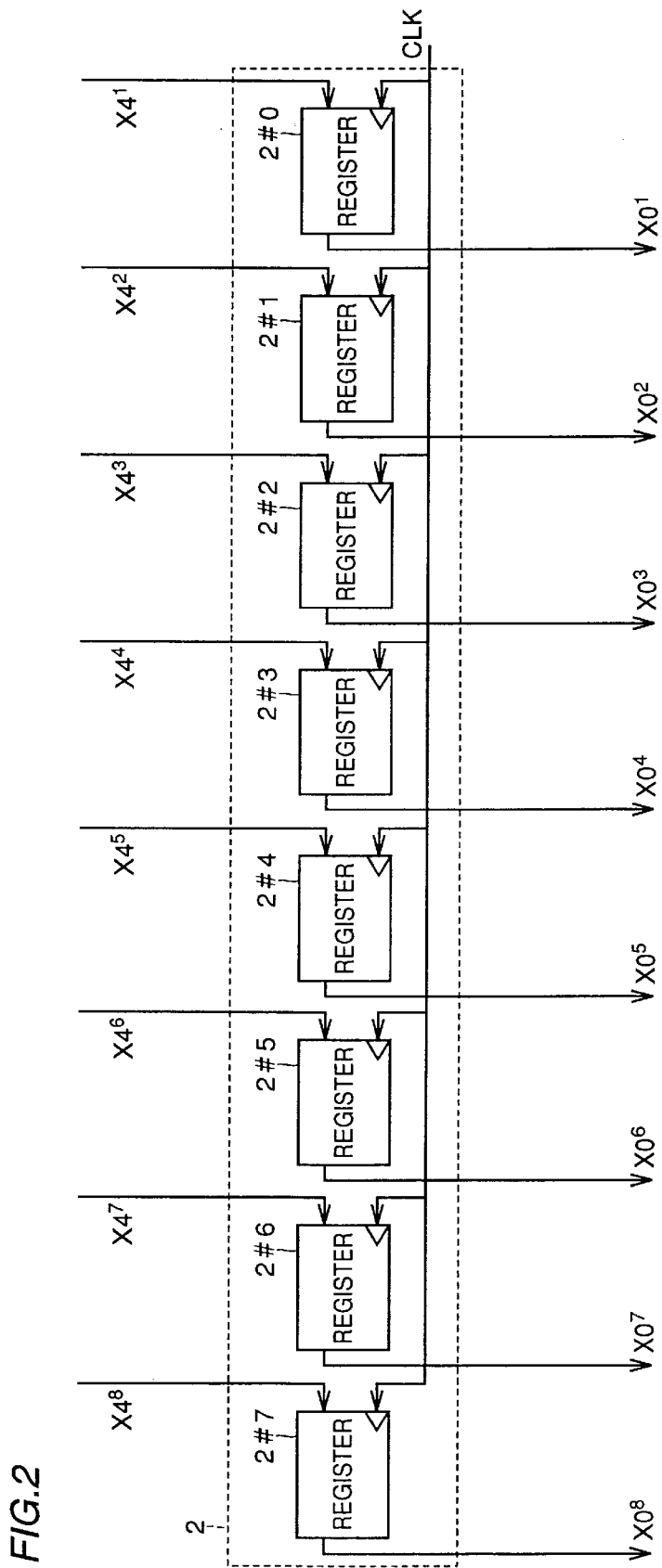
FIG. 2 is a circuit diagram showing the structure of a hold circuit 2 appearing in FIG. 1.

FIG. 2 is a circuit diagram showing the structure of the hold circuit 2 appearing in FIG. 1.

Referring to FIG. 2, the hold circuit 2 includes a register 2#0 receiving the data $X4^1$, capturing the same in response to the clock signal CLK and outputting the data $X0^1$, a register 2#1 receiving the data $X4^2$, capturing the same in response to the clock signal CLK and outputting the data $X0^2$, a register 2#2 receiving the data $X4^3$, capturing the same in response to the clock signal CLK and outputting the data $X0^3$ and a register 2#3 receiving the data $X4^4$, capturing the same in response to the clock signal CLK and outputting the data $X0^4$.

The hold circuit 2 further includes a register 2#4 receiving the data $X4^5$, capturing the same in response to the clock signal CLK and outputting the data $X0^5$, a register 2#5 receiving the data $X4^6$, capturing the same in response to the clock signal CLK and outputting the data $X0^6$, a register 2#6 receiving the data $X4^7$, capturing the same in response to the clock signal CLK and outputting the data $X0^7$ and a register 2#7 receiving the data $X4^8$, capturing the same in response to the clock signal CLK and outputting the data $X0^8$.

Figure 3:
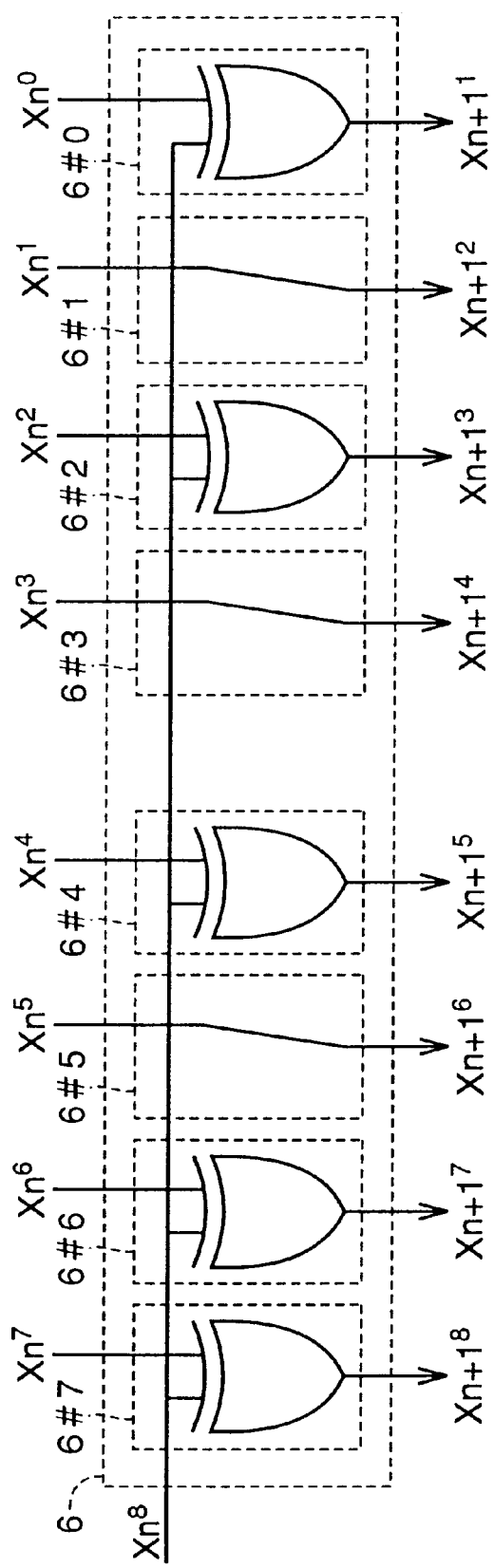
FIG. 3 is a circuit diagram showing the structure of an arithmetic circuit 6 appearing in FIG. 1.

FIG. 3 is a circuit diagram showing the structure of the arithmetic circuit 6 appearing in FIG. 1.

Referring to FIG. 3, the arithmetic circuit 6 includes a gate circuit 6#0 receiving the data $Xn^0$ and the data $Xn^8$ and outputting data $Xn+1^1$, a gate circuit 6#1 receiving the data $Xn^1$ and the data $Xn^8$ and outputting data $Xn+1^2$, a gate circuit 6#2 receiving the data $Xn^2$ and the data $Xn^8$ and outputting data $Xn+1^3$ and a gate circuit 6#3 receiving the data $Xn^3$ and the data $Xn^8$ and outputting data $Xn+1^4$.

The arithmetic circuit 6 further includes a gate circuit 6#4 receiving the data $Xn^4$ and the data $Xn^8$ and outputting data $Xn+1^5$, a gate circuit 6#5 receiving the data $Xn^5$ and the data $Xn^8$ and outputting data $Xn+1^6$, a gate circuit 6#6 receiving the data $Xn^6$ and the data $Xn^8$ and outputting data $Xn+1^7$ and a gate circuit 6#7 receiving the data $Xn^7$ and the data $Xn^8$ and outputting data $Xn+1^8$.

Each gate circuit has an XOR circuit arranged on a position corresponding to the generating polynomial, and receives data $Xn^k$ in the remaining position for outputting data $Xn+1^{k+1}$ intact (k: integer of 0 to 7). While the gate circuits 6#0 to 6#8 are simply connected by wires for outputting the data intact, circuits such as buffer circuits not changing the polarity of data may alternatively be arranged.

The arithmetic circuits 8, 10 and 12 shown in FIG. 1 are similar in structure to the arithmetic circuit 6. FIG. 3 shows the structure of the arithmetic circuit 6 when n=0, the structure of the arithmetic circuit 8 when n=1, the structure of the arithmetic circuit 10 when n=2, and the structure of the arithmetic circuit 12 when n=3. Therefore, redundant description is not repeated.

Figure 4:
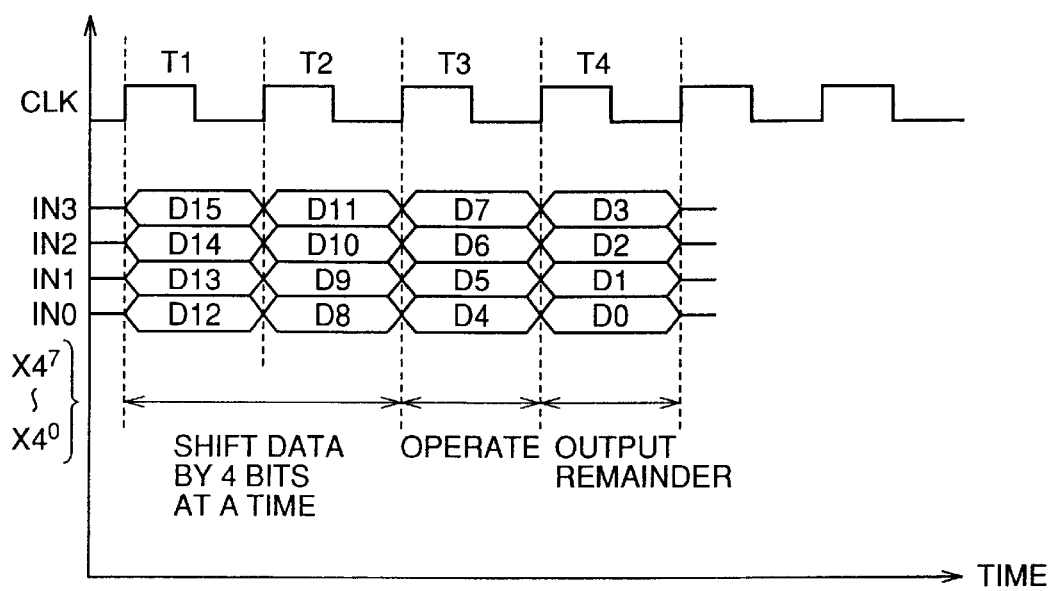
FIG. 4 is an operation waveform diagram for illustrating operations of the CRC arithmetic unit 1 shown in FIG. 1.

FIG. 4 is an operation waveform diagram for illustrating operations of the CRC arithmetic unit 1 shown in FIG. 1.

Referring to FIG. 4, data D12 to D15 forming upper four bits of a data string are input in the inputs IN0 to IN3 in a clock cycle T1.

Then, data D8 to D11 are input in the inputs IN0 to IN3 in a clock cycle T2. In the clock cycles T1 and T2, the hold circuit 2 is not filled with data and hence the data in the hold circuit 2 are shifted by four bits at a time. When data D4 to D7 are input in the inputs IN0 to IN3 in a clock cycle T3, the CRC arithmetic unit 1 starts an operation. When data D0 to D3 are input in the inputs IN0 to IN3 in a clock cycle T4, the CRC arithmetic unit 1 responsively outputs the remainder to the data $X4^1$ to $X4^8$.

Operations of the CRC arithmetic unit 1 receiving the same data as those in the conventional circuit described with reference to FIGS. 18 to 25 are now described.

Figure 5:
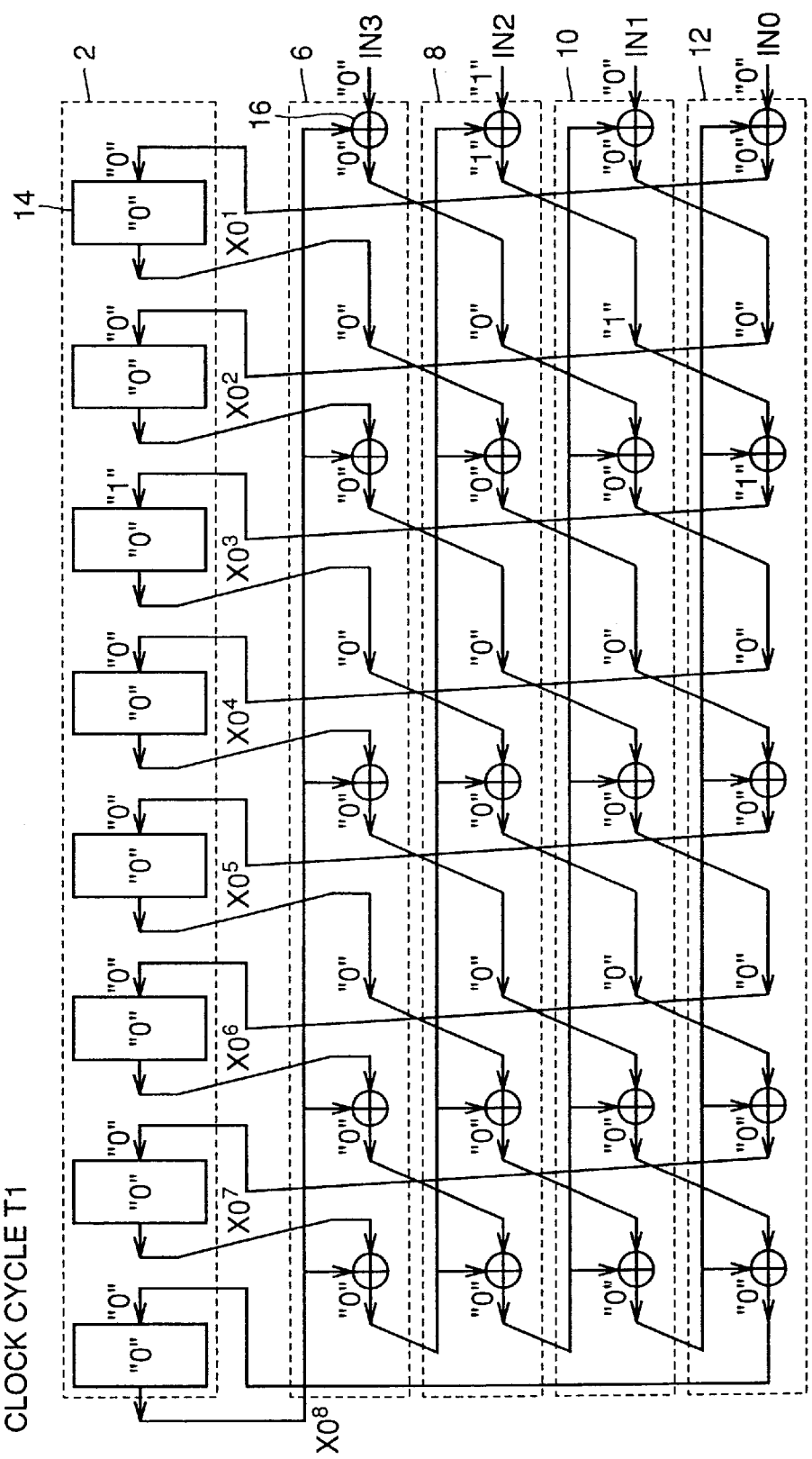
FIG. 5 is a diagram for illustrating operations of the CRC arithmetic unit 1 in a clock cycle T1 shown in FIG. 4.

FIG. 5 is a diagram for illustrating the operation of the CRC arithmetic unit 1 in the clock cycle T1 of FIG. 4.

Referring to FIG. 5, reference numerals of the elements are simplified for simplifying the illustration. A register 14 corresponds to the register 2#0 shown in FIG. 2, and an XOR circuit 16 corresponds to the gate circuit 6#0 shown in FIG. 3.

Referring to FIGS. 4 and 5, "0", "1", "0" and "0" are input from the inputs IN3, IN2, IN1 and IN0 as the data D15, D14, D13 and D12 respectively in the clock cycle T1. It is assumed that the hold circuit 2 initially holds data "0000 0000". Although not illustrated, values held in all registers included in the hold circuit 2 are generally initialized to "0" in response to a reset signal, for example.

At this time, the arithmetic circuit 6 receives "0 0000 0000" as the data $X0^8$ to $X0^0$. In response, the arithmetic circuit 6 outputs "0000 0000" as the data $X1^8$ to $X1^1$.

The arithmetic circuit 8 outputs "0000 0001" as the data $X2^8$ to $X2^1$ in response to the output from the arithmetic circuit 6 and "1" input from the input IN2. The arithmetic circuit 10 outputs "0000 0010" as the data $X3^8$ to $X3^1$ in response to the output from the arithmetic circuit 8 and "0" input from the input IN1.

The arithmetic circuit 12 outputs "0000 0100" as the data $X4^8$ to $X4^1$ in response to the output from the arithmetic circuit 10 and "0" input from the input IN0. The hold circuit 2 captures the data $X4^8$ to $X4^1$ in the next clock cycle T2.

Figure 6:
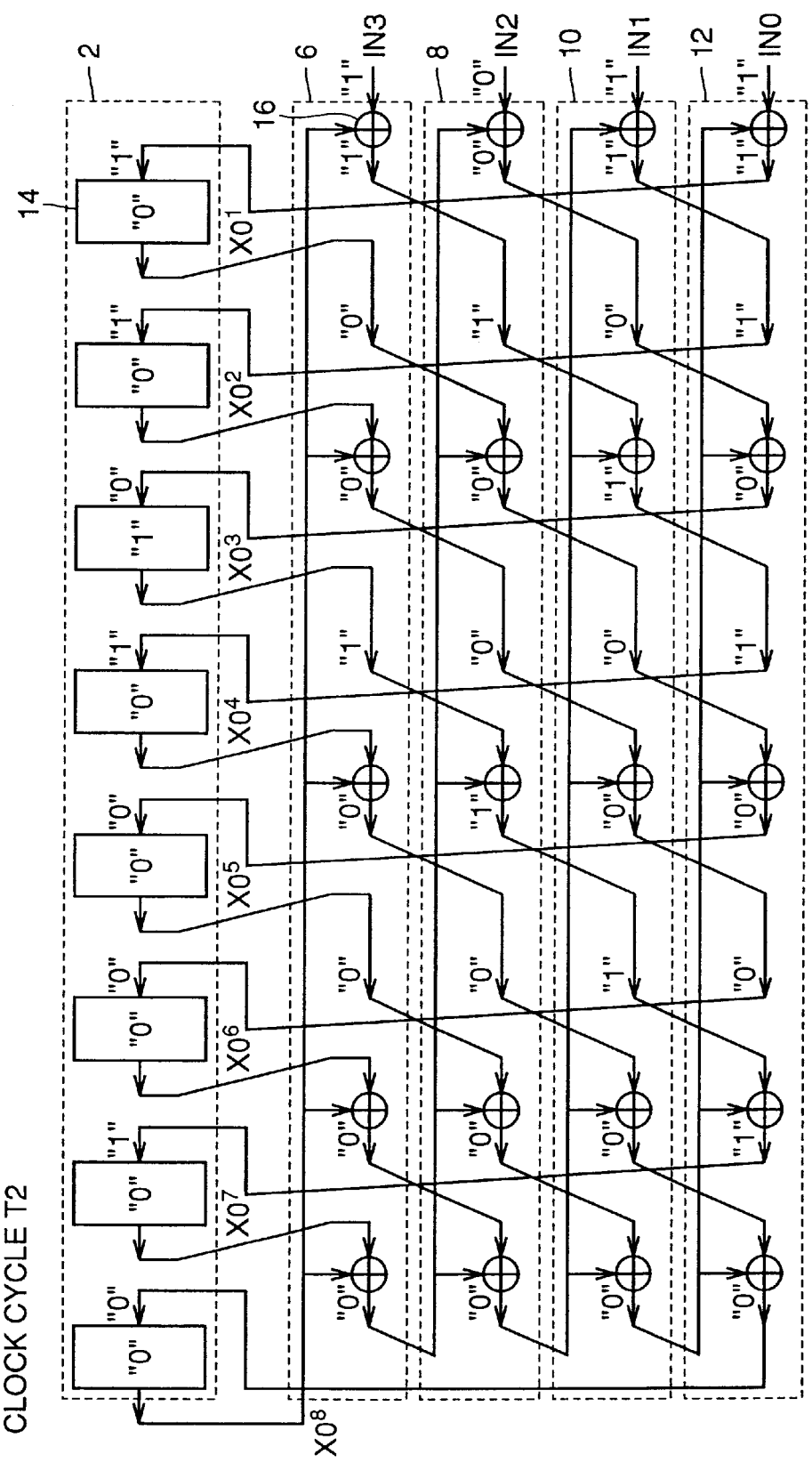
FIG. 6 is a diagram for illustrating operations of the CRC arithmetic unit 1 in a clock cycle T2 shown in FIG. 4.

FIG. 6 is a diagram for illustrating the operation of the CRC arithmetic unit 1 in the clock cycle T2 of FIG. 4.

Referring to FIGS. 4 and 6, "1", "0", "1" and "1" are input as the data D11, D10, D9 and D8 respectively.

The hold circuit 2 captures and holds the data "0000 0100" output from the arithmetic circuit 12 in the clock cycle T1.

The arithmetic circuit 6 outputs "0000 1001" in response to the output from the hold circuit 2 and "1" input from the input IN3. The arithmetic circuit 8 outputs "0001 0010" in response to the output from the arithmetic circuit 6 and "0" input from the input IN2.

The arithmetic circuit 10 outputs "0010 0101" in response to the output from the arithmetic circuit 8 and "1" supplied from the input IN1. The arithmetic circuit 12 outputs data "0100 1011" in response to the output from the arithmetic circuit 10 and "1" input from the input IN0.

The hold circuit 2 outputs "0000" as the data $X0^8$ to $X0^5$ in the clock cycles T1 and T2, and hence it is understood that the data input from the inputs IN0 to IN3 are shifted in the hold circuit 2 by four bits at a time.

Figure 7:
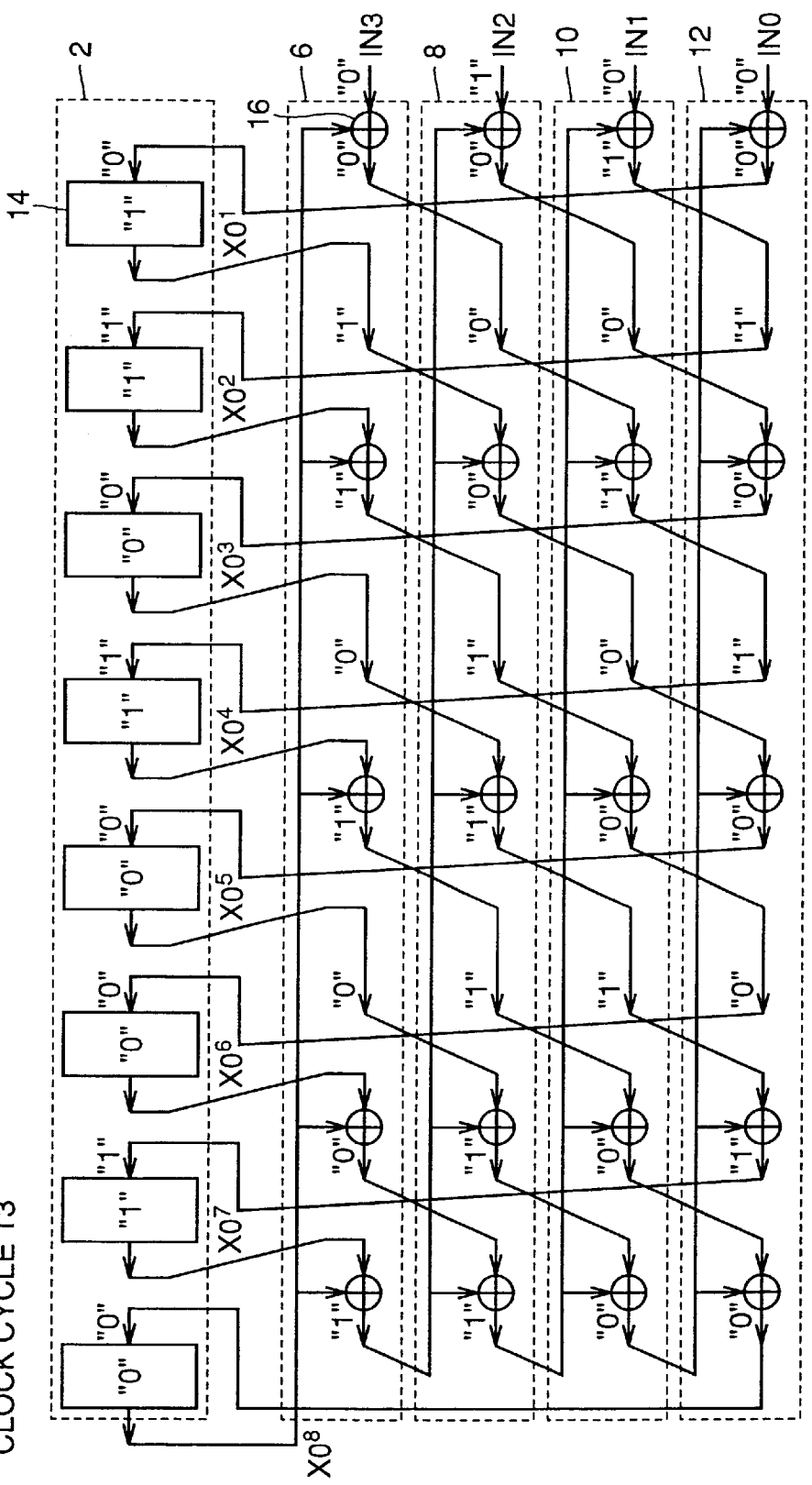
FIG. 7 is a diagram for illustrating operations of the CRC arithmetic unit 1 in a clock cycle T3 shown in FIG. 4.

FIG. 7 is a diagram for illustrating the operation of the CRC arithmetic unit 1 in the clock cycle T3 of FIG. 4.

Referring to FIGS. 4 and 7, the hold circuit 2 captures the data "0100 1011" output from the arithmetic circuit 12 in the clock cycle T2. The arithmetic circuit 6 outputs "1001 0110" in response to the output from the hold circuit 2 and "0" supplied from the input IN3. The arithmetic circuit 8 outputs "1111 1000" in response to the output from the arithmetic circuit 6 and "1" supplied from the input IN2.

The arithmetic circuit 10 outputs data "0010 0101" in response to the output from the arithmetic circuit 8 and "0" supplied from the input IN1. The arithmetic circuit 12 outputs data "0100 1010" in response to the output from the arithmetic circuit 10 and "0" supplied from the input IN0.

Figure 8:
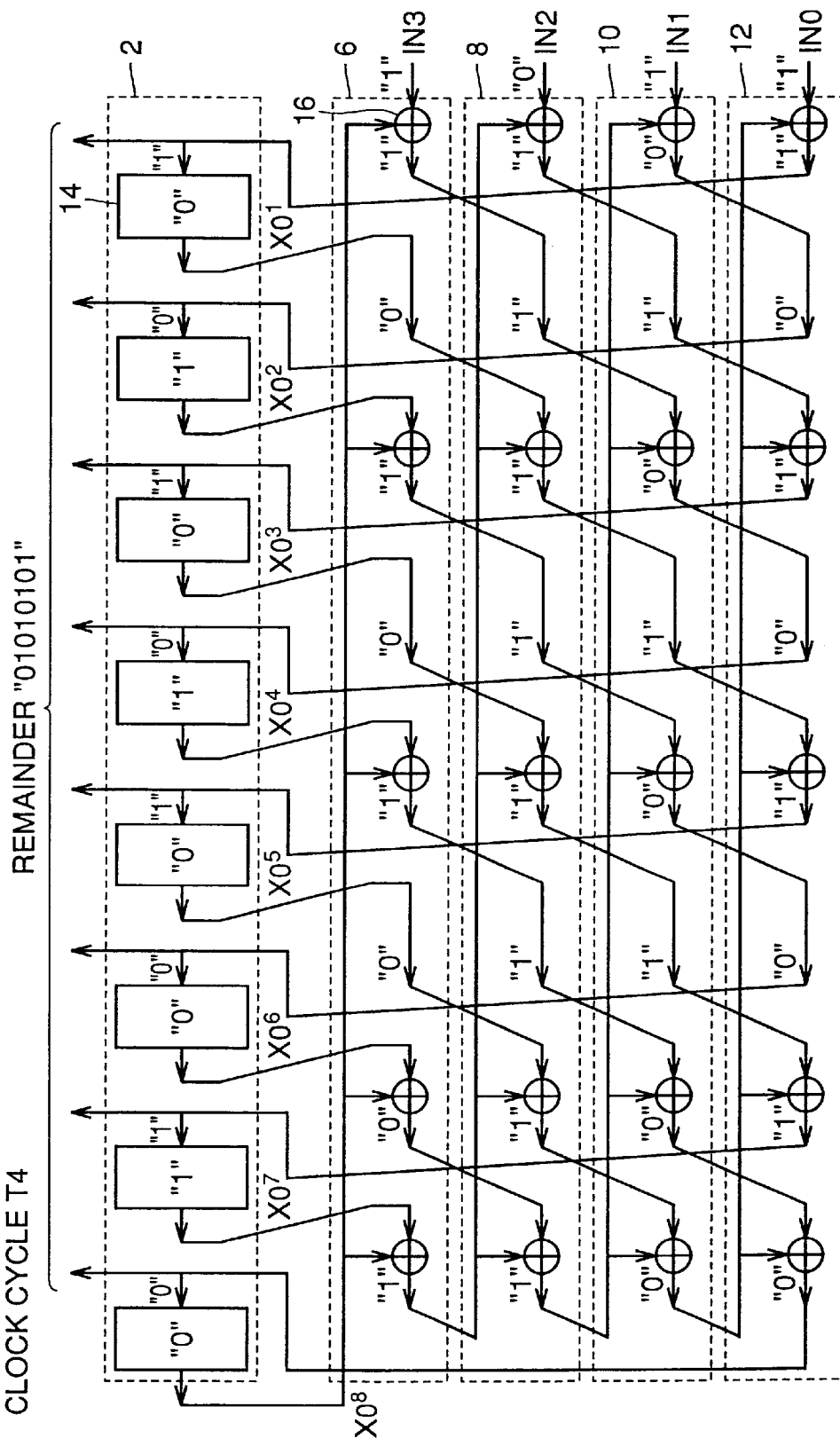
FIG. 8 is a diagram for illustrating operations of the CRC arithmetic unit 1 in a clock cycle T4 shown in FIG. 4.

FIG. 8 is a diagram for illustrating the operation of the CRC arithmetic unit 1 in the clock cycle T4 of FIG. 4.

Referring to FIGS. 4 and 8, the hold circuit 2 captures the data "0100 1010" output from the arithmetic circuit 12 in the clock cycle T3. The arithmetic circuit 6 outputs "1001 0101" in response to the value held in the hold circuit 2 and "1" input from the input IN3. The arithmetic circuit 8 outputs "1111 1111" in response to the output from the arithmetic circuit 6 and "0" supplied from the input IN2.

The arithmetic circuit 10 outputs data "0010 1010" in response to the output from the arithmetic circuit 8 and "1" supplied from the input IN1. The arithmetic circuit 12 outputs data "0101 0101" in response to the output from the arithmetic circuit 10 and "1" input from the input IN0. When outputting the output of the arithmetic circuit 12 as the remainder, it follows that the CRC arithmetic unit 1 implements in the clock cycles T1 to T4 division similar to that of the conventional circuit shown in FIGS. 18 to 25.

As described above, the CRC arithmetic unit 1 according to the first embodiment can simultaneously process multiple bits in a single clock cycle for performing a CRC operation at a high speed.

While the CRC arithmetic unit 1 shown in FIG. 1 receives and processes four bits at a time, the processing is speeded up as compared with the conventional CRC arithmetic unit performing processing bit by bit when processing a plurality of bits at a time, and hence the number of bits can be properly increased/decreased in response to the required speed so far as the number is at least two.

When the number of bits included in the data string to be processed cannot be divided by 4, i.e., the number of bits subjected to batch processing, "0" may be supplied to the upper side (most significant bit side) of the data string for separating the data string into a number corresponding to a divisor of 4. For example, data input in order of "abcdefghij" can be processed by inputting the same as "00ab", "cdef" and "ghij".

[Second Embodiment]

Several types of systems employing different generating polynomials are present for the CRC operation. In this case, the positions for arranging the XOR circuits must be varied with the generating polynomials in the arithmetic unit 1 shown in FIG. 3. However, it is not easy to change hardware in a highly integrated semiconductor device or the like.

Figure 9:
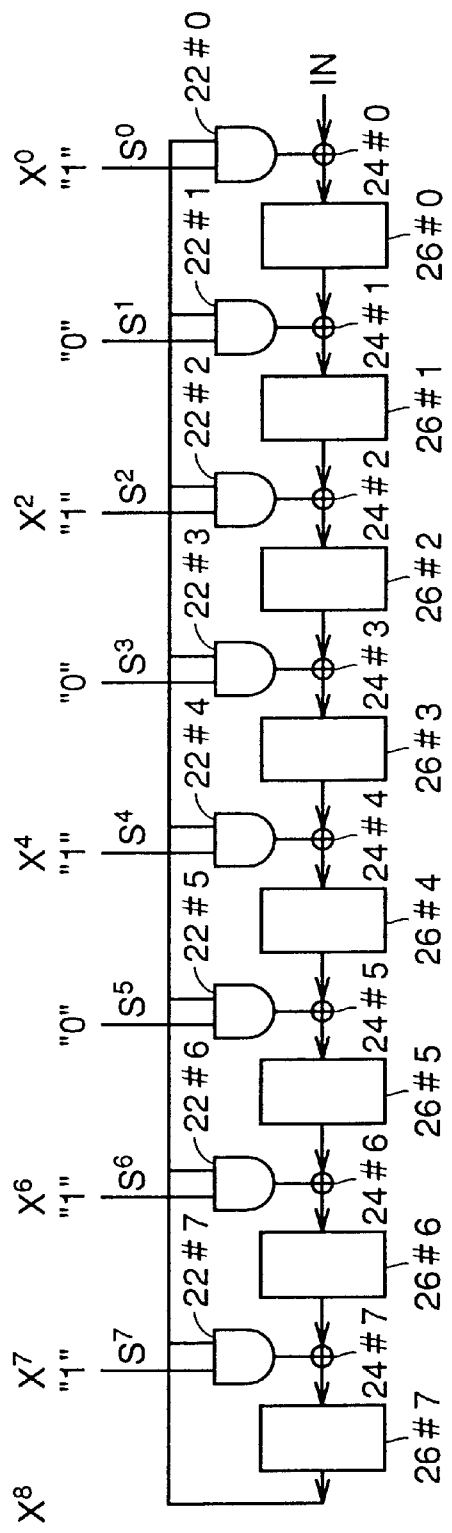
FIG. 9 is a circuit diagram showing the structure of a CRC arithmetic unit 20 capable of readily dealing with change of a generating polynomial.

FIG. 9 is a circuit diagram showing the structure of a CRC arithmetic unit 20 capable of readily dealing with change of a generating polynomial.

Referring to FIG. 9, the CRC arithmetic unit 20 includes AND circuits 22#0 to 22#7, XOR circuits 24#0 to 24#7 and registers 26#0 to 26#7.

The AND circuit 22#0 receives an output of the register 26#7 and a set value "1" input as set data $S^0$. The XOR circuit 24#0 receives an output of the AND circuit 22#0 and data input from an input IN. The register 26#0 captures an output of the XOR circuit 24#0 in response to a clock signal (not shown).

The AND circuit 22#1 receives the output of the register 26#7 and a set value "0" input as set data $S^1$. The XOR circuit 24#1 receives outputs of the register 26#0 and the AND circuit 22#1. The register 26#1 captures and holds an output of the XOR circuit 24#1 in response to the clock signal (not shown).

The AND circuit 22#2 receives the output of the register 26#7 and a set value "1" input as set data $S^2$. The XOR circuit 24#2 receives outputs of the register 26#1 and the AND circuit 22#2. The register 26#2 captures and holds an output of the XOR circuit 24#2 in response to the clock signal (not shown).

The AND circuit 22#3 receives the output of the register 26#7 and a set value "0" input as set data $S^3$. The XOR circuit 24#3 receives outputs of the AND circuit 22#3 and the register 26#2. The register 26#3 captures and holds an output of the XOR circuit 24#3 in response to the clock signal (not shown).

The AND circuit 22#4 receives the output of the register 26#7 and a set value "1" input as set data $S^4$. The XOR circuit 24#4 receives outputs of the AND circuit 22#4 and the register 26#3. The register 26#4 captures and holds an output of the XOR circuit 24#4 in response to the clock signal (not shown).

The AND circuit 22#5 receives the output of the register 26#7 and a set value "0" input as set data $S^5$. The XOR circuit 24#5 receives outputs of the AND circuit 22#5 and the register 26#4. The register 26#5 captures and holds an output of the XOR circuit 24#5 in response to the clock signal (not shown).

The AND circuit 22#6 receives the output of the register 26#7 and a set value "1" input as set data $S^6$. The XOR circuit 24#6 receives outputs of the AND circuit 22#6 and the register 26#5. The register 26#6 captures and holds an output of the XOR circuit 24#6 in response to the clock signal (not shown).

The AND circuit 22#7 receives the output of the register 26#7 and a set value "1" input as set data $S^7$. The XOR circuit 24#7 receives outputs of the AND circuit 22#7 and the register 26#4. The register 26#7 captures and holds an output of the XOR circuit 24#7 in response to the clock signal (not shown).

Thus, the CRC arithmetic unit 20 can deal with change of the generating polynomial by changing the set values supplied as the set data $S^0$ to $S^7$.

When supplying set values "1101 0101" as the set data $S^0$ to $S^7$, the generating polynomial is as follows:

$$G(X)=X^8+X^7+X^6+X^4+X^2+1$$

Figure 17:
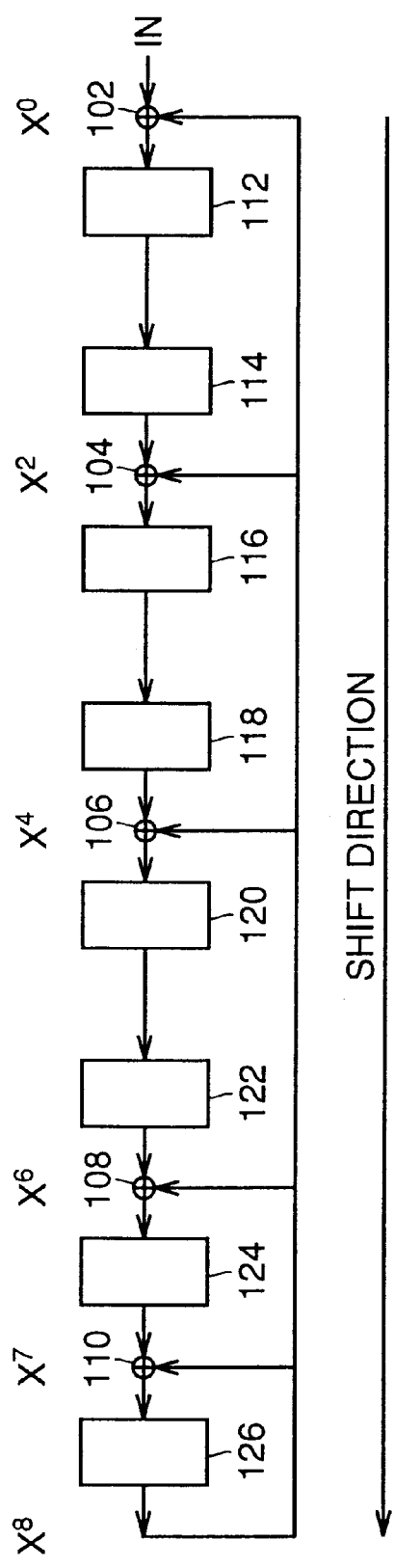
FIG. 17 is a conceptual diagram showing the structure of a conventional CRC arithmetic unit 100 performing the division shown in FIGS. 15 and 16.
Figure 18:
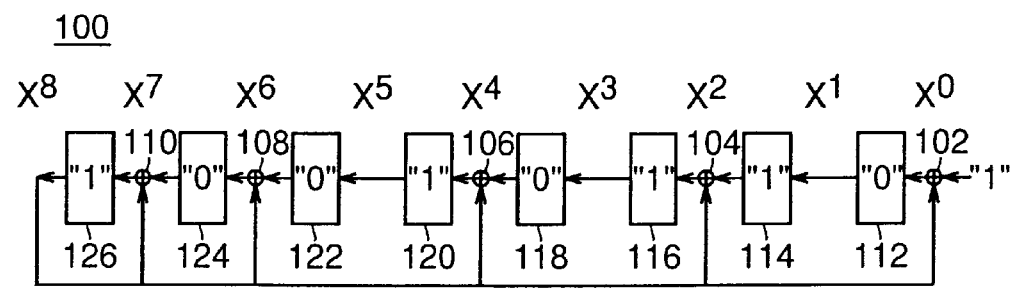
FIGS. 18 to 25 are first to eighth diagrams showing the process of operations performed by the CRC arithmetic unit 100 shown in FIG. 17.
Figure 19:
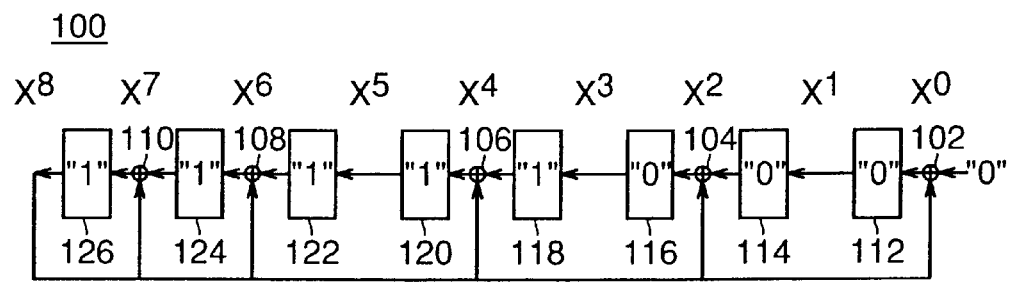
Figure 20:
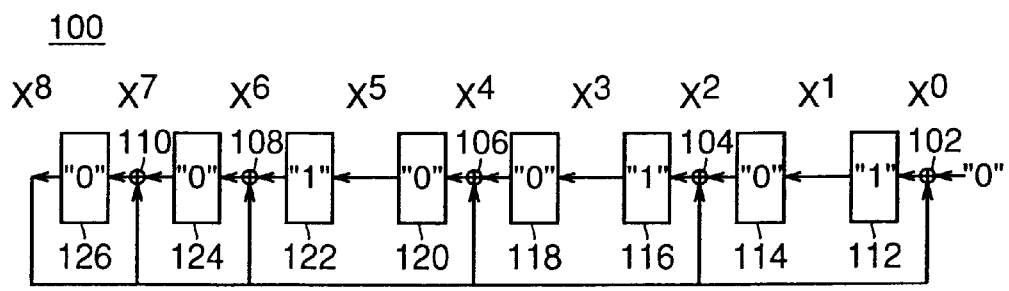
Figure 21:
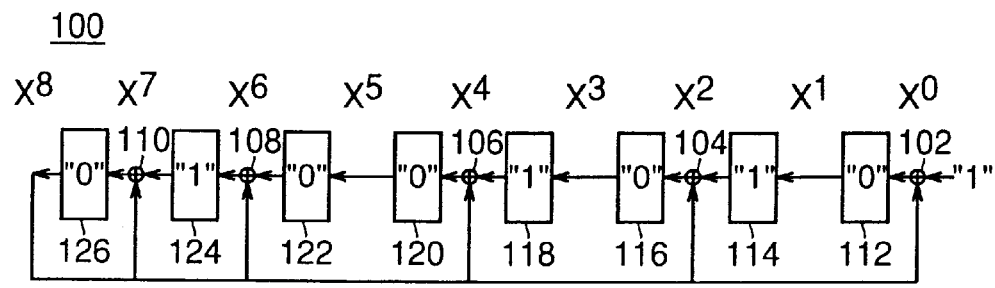
Figure 22:
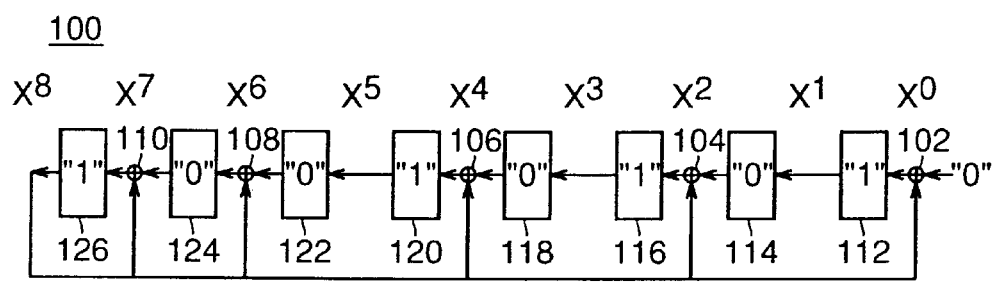
Figure 23:
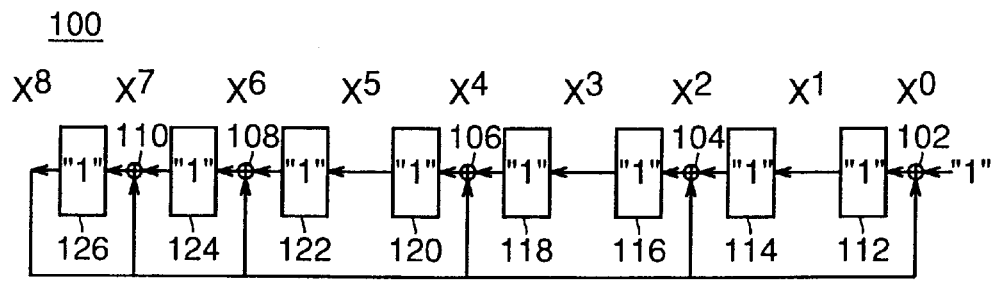
Figure 24:
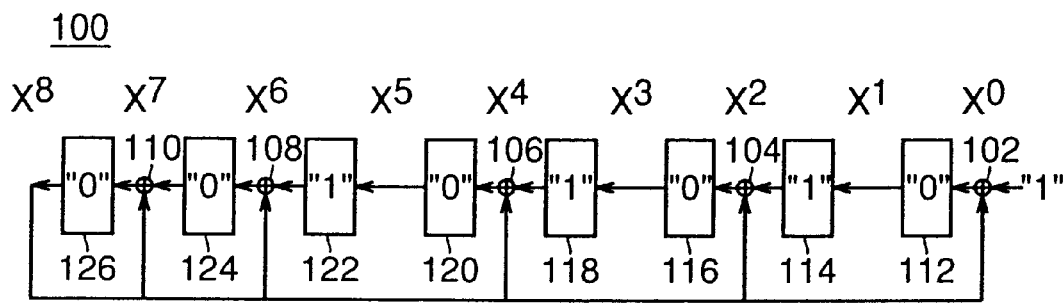
Figure 25:
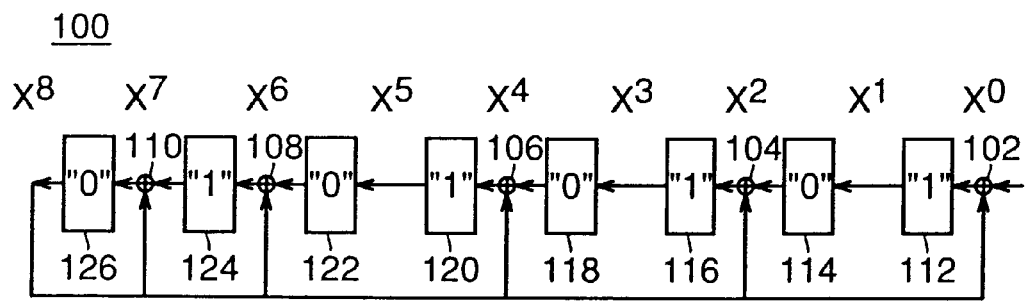

Therefore, the CRC arithmetic unit 20 can perform operations similar to those of the conventional CRC arithmetic unit 100 shown in FIG. 17.

A CRC arithmetic unit capable of readily dealing with change of a generating polynomial and batch-processing multiple bits is studied.

Figure 10:
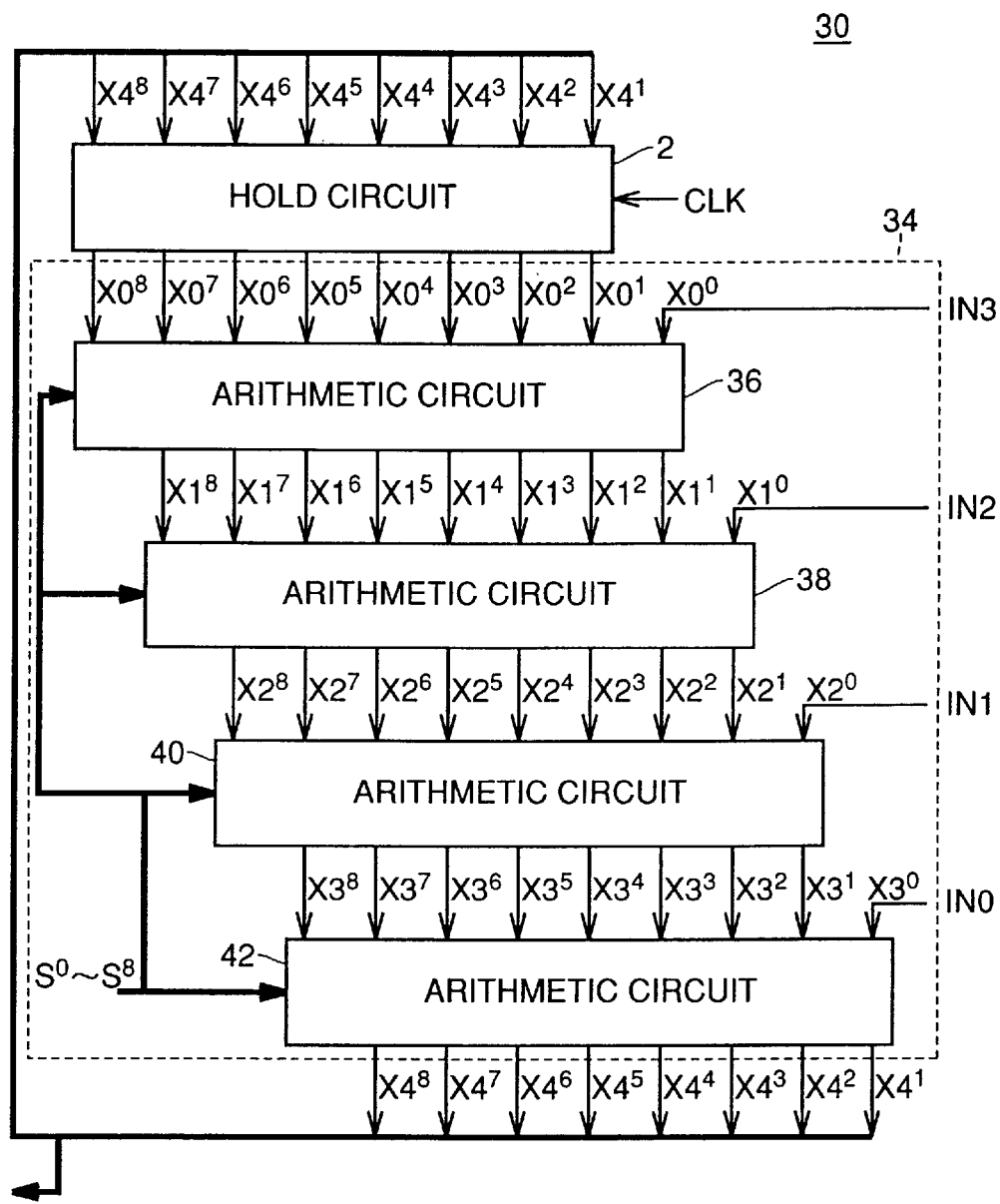
FIG. 10 is a schematic block diagram showing the structure of a CRC arithmetic unit 30 according to a second embodiment of the present invention.

FIG. 10 is a schematic block diagram showing the structure of a CRC arithmetic unit 30 according to a second embodiment of the present invention.

Referring to FIG. 10, the CRC arithmetic unit 30 includes an arithmetic circuit 34 in place of the arithmetic circuit 4 in the structure of the CRC arithmetic unit 1 shown in FIG. 1.

The arithmetic circuit 34 includes arithmetic circuits 36, 38, 40 and 42 in place of the arithmetic circuits 6, 8, 10 and 12 respectively in the structure of the arithmetic circuit 4 shown in FIG. 1. The arithmetic circuits 37, 38, 40 and 42 are capable of dealing with change of a generating polynomial in response to set values input as set data $S^0$ to $S^7$. The remaining connection is similar to that of the CRC arithmetic unit 1 shown in FIG. 1, and hence redundant description is not repeated.

Figure 11:
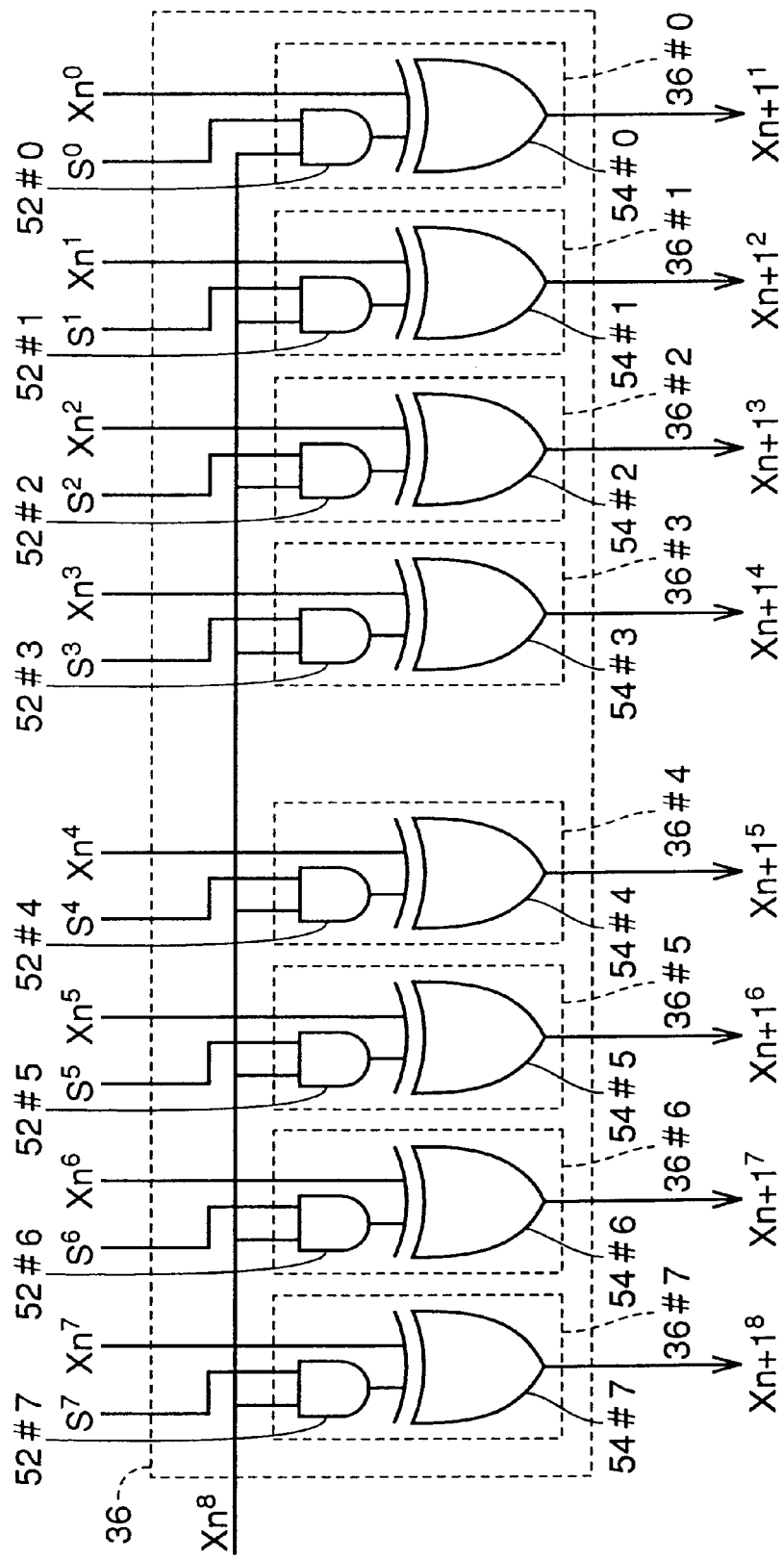
FIG. 11 is a circuit diagram showing the structure of an arithmetic circuit 36 appearing in FIG. 10.

FIG. 11 is a circuit diagram showing the structure of the arithmetic circuit 36 appearing in FIG. 10.

Referring to FIG. 11, the arithmetic circuit 36 includes a gate circuit 36#0 receiving data $Xn^0$ and $Xn^8$ and the set data $S^0$ and outputting data $Xn+1^1$, a gate circuit 36#1 receiving data $Xn^1$ and $Xn^8$ and the set data $S^1$ and outputting data $Xn+1^2$, a gate circuit 36#2 receiving data $Xn^2$ and $Xn^8$ and the set data $S^2$ and outputting data $Xn+1^3$ and a gate circuit 36#3 receiving data $Xn^3$ and $Xn^8$ and the set data $S^3$ and outputting data $Xn+1^4$.

The arithmetic circuit 36 further includes a gate circuit 36#4 receiving data $Xn^4$ and $Xn^8$ and the set data $S^4$ and outputting data $Xn+1^5$, a gate circuit 36#5 receiving data $Xn^5$ and $Xn^8$ and the set data $S^5$ and outputting data $Xn+1^6$, a gate circuit 36#6 receiving data $Xn^6$ and $Xn^8$ and the set data $S^6$ and outputting data $Xn+1^7$ and a gate circuit 36#7 receiving data $Xn^7$ and $Xn^8$ and the set data $S^7$ and outputting data $Xn+1^8$.

The gate circuit 36#0 includes an AND circuit 52#0 receiving the data $Xn^8$ and the set data $S^0$ and an XOR circuit 54#0 receiving an output of the AND circuit 52#0 and the data $Xn^0$ and outputting the data $Xn+1^1$.

The gate circuit 36#1 includes an AND circuit 52#1 receiving the data $Xn^8$ and the set data $S^1$ and an XOR circuit 54#1 receiving an output of the AND circuit 52#1 and the data $Xn^1$ and outputting the data $Xn+1^2$.

The gate circuit 36#2 includes an AND circuit 52#2 receiving the data $Xn^8$ and the set data $S^2$ and an XOR circuit 54#2 receiving an output of the AND circuit 52#2 and the data $Xn^2$ and outputting the data $Xn+1^3$.

The gate circuit 36#3 includes an AND circuit 52#3 receiving the data $Xn^8$ and the set data $S^3$ and an XOR circuit 54#3 receiving an output of the AND circuit 52#3 and the data $Xn^3$ and outputting the data $Xn+1^4$.

The gate circuit 36#4 includes an AND circuit 52#4 receiving the data $Xn^8$ and the set data $S^4$ and an XOR circuit 54#4 receiving an output of the AND circuit 52#4 and the data $Xn^4$ and outputting the data $Xn+1^5$.

The gate circuit 36#5 includes an AND circuit 52#5 receiving the data $Xn^8$ and the set data $S^5$ and an XOR circuit 54#5 receiving an output of the AND circuit 52#5 and the data $Xn^5$ and outputting the data $Xn+1^6$.

The gate circuit 36#6 includes an AND circuit 52#6 receiving the data $Xn^8$ and the set data $S^6$ and an XOR circuit 54#6 receiving an output of the AND circuit 52#6 and the data $Xn^6$ and outputting the data $Xn+1^7$.

The gate circuit 36#7 includes an AND circuit 52#7 receiving the data $Xn^8$ and the set data $S^7$ and an XOR circuit 54#7 receiving an output of the AND circuit 52#7 and the data $Xn^7$ and outputting the data $Xn+1^8$.

The arithmetic circuits 38, 40 and 42 shown in FIG. 10 are similar in structure to the arithmetic circuit 36. FIG. 11 shows the structure of the arithmetic circuit 36 when n=0, the structure of the arithmetic circuit 38 when n=1, the structure of the arithmetic circuit 40 when n=2, and the structure of the arithmetic circuit 42 when n=3. Therefore, redundant description is not repeated.

Figure 12:
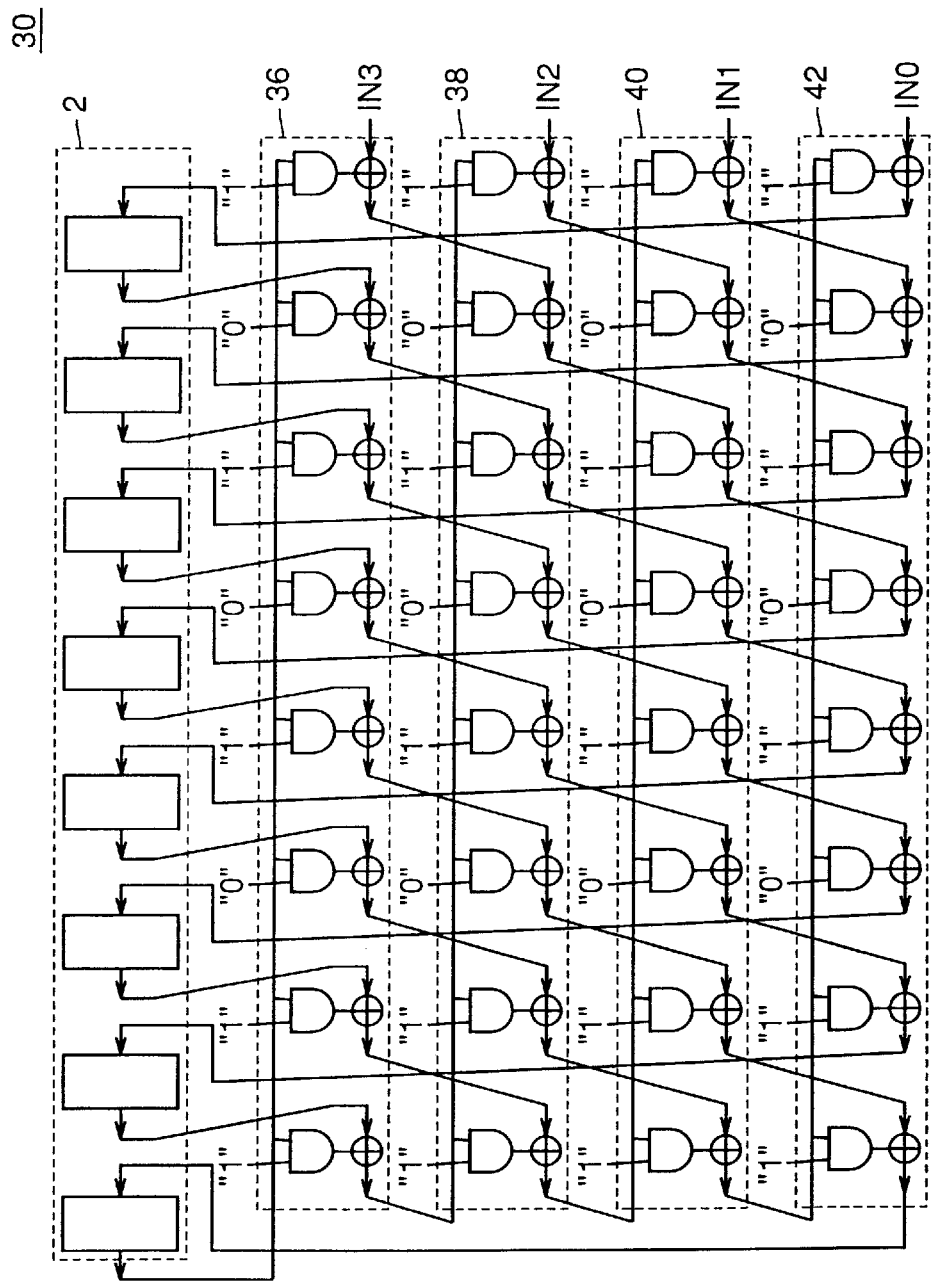
FIG. 12 illustrates a state setting set data $S^7$ to $S^0$ of the CRC arithmetic unit 30.

FIG. 12 illustrates a state of setting the set data $S^7$ to $S^0$ of the CRC arithmetic unit 30.

Referring to FIG. 12, set values "1101 0101" are supplied as the set data $S^7$ to $S^0$. In this structure setting the set values "1101 0101" as the set data $S^7$ to $S^0$, the CRC arithmetic unit 30 is equivalent to the CRC arithmetic unit 1 according to the first embodiment described with reference to FIGS. 1 to 8 and can perform similar operations. Further, the CRC arithmetic unit 30 can flexibly deal with change of the generating polynomial by properly changing the set data $S^7$ to $S^0$.

[Third Embodiment]

The CRC arithmetic unit 30 according to the second embodiment can deal with change of a generating polynomial having the highest degree of $X^8$. In a third embodiment of the present invention, a CRC arithmetic unit capable of changing the degree of a generating polynomial is studied.

Figure 13:
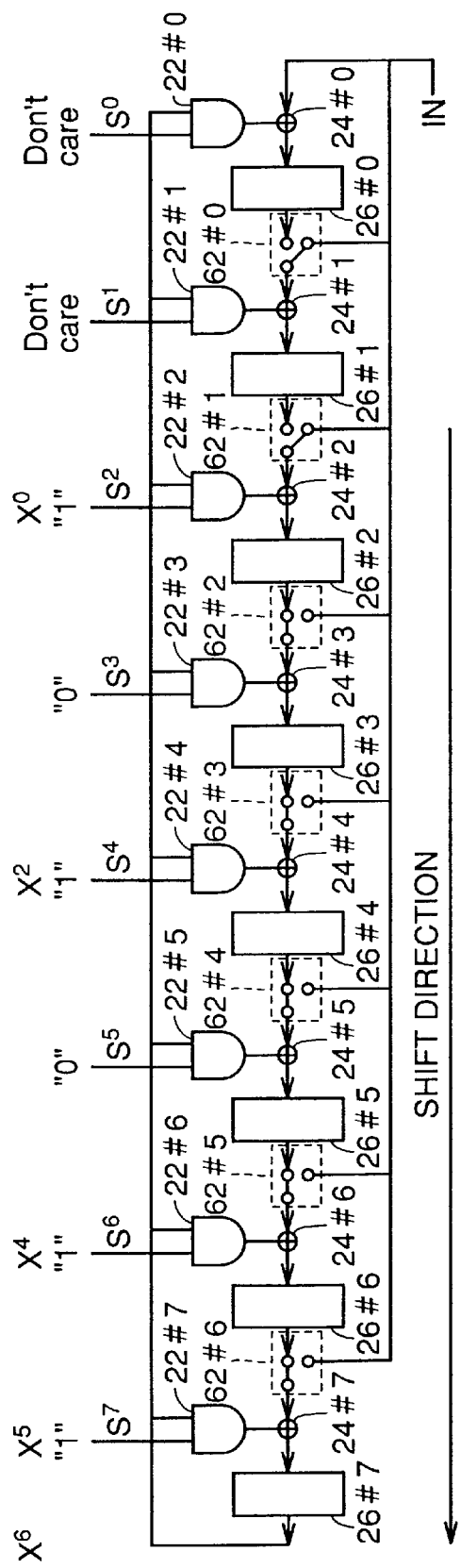
FIG. 13 is a circuit diagram showing the structure of a CRC arithmetic unit 60 obtained by modifying the CRC arithmetic unit 20 shown in FIG. 9 to be capable of changing the degree of a generating polynomial.

FIG. 13 is a circuit diagram showing the structure of a CRC arithmetic unit 60 obtained by modifying the CRC arithmetic unit 20 shown in FIG. 9 to be capable of changing the degree of a generating polynomial.

Referring to FIG. 13, the CRC arithmetic unit 60 further includes switching circuits 62#0 to 62#6 in the structure of the CRC arithmetic unit 20 shown in FIG. 9.

The switching circuit 62#0 supplies either an output of a register 26#0 or data input from an input IN to an XOR circuit 24#1. The switching circuit 62#1 supplies either an output of a register 26#1 or the data input from the input IN to an XOR circuit 24#2. The switching circuit 62#2 supplies either an output of a register 26#2 or the data input from the input IN to an XOR circuit 24#3. The switching circuit 62#3 supplies either an output of a register 26#3 or the data input from the input IN to an XOR circuit 24#4.

The switching circuit 62#4 supplies either an output of a register 26#4 or the data input from the input IN to an XOR circuit 24#5. The switching circuit 62#5 supplies either an output of a register 26#5 or the data input from the input IN to an XOR circuit 24#6. The switching circuit 62#6 supplies either an output of a register 26#6 or the data input from the input IN to an XOR circuit 24#7.

Referring to FIG. 13, the switching circuits 62#0 and 62#1 select the input IN and supply the input to the next-stage XOR circuits 24#1 and 24#2. The switching circuits 62#2 to 62#6 select the outputs of the registers 26#2 to 26#6 respectively and supply the same to the next-stage XOR circuits 24#3 to 24#7. Thus, the CRC arithmetic unit 60 can set the highest degree of the generating polynomial to $X^6$. When setting set data $S^0$ to $S^7$ to "11010100", the generating polynomial is as follows:

$$G(X)=X^6+X^5+X^4+X^2+X^0$$

At this time, the set data $S^0$ and $S^1$ may be not "0" but "1".

Description is now made on a CRC arithmetic unit according to the third embodiment of the present invention enabling change of the degree when batch-processing multiple bits.

Figure 14:
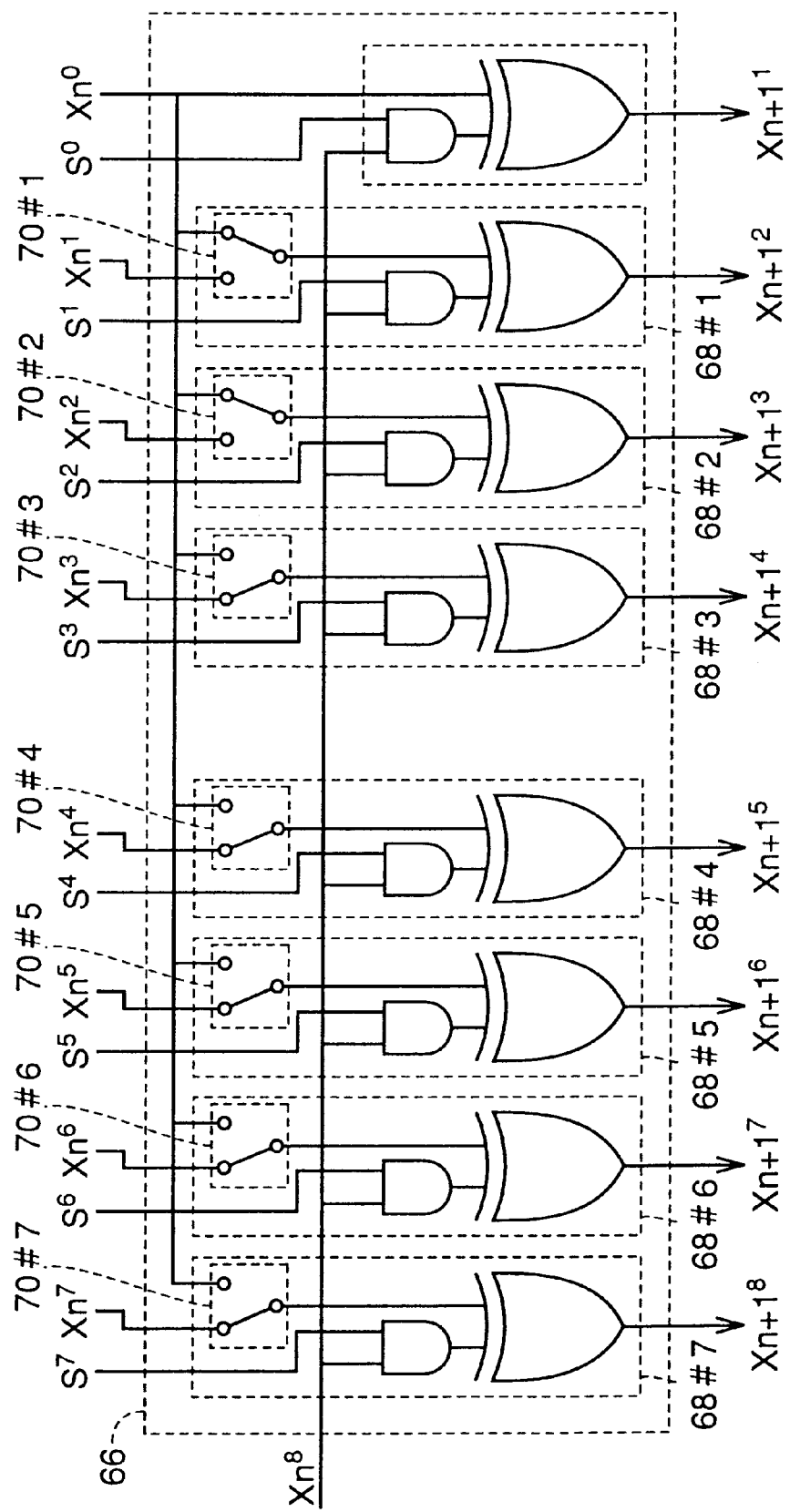
FIG. 14 is a circuit diagram showing the structure of an arithmetic circuit 66 employed in a CRC arithmetic unit according to a third embodiment of the present invention.
Figure 15:
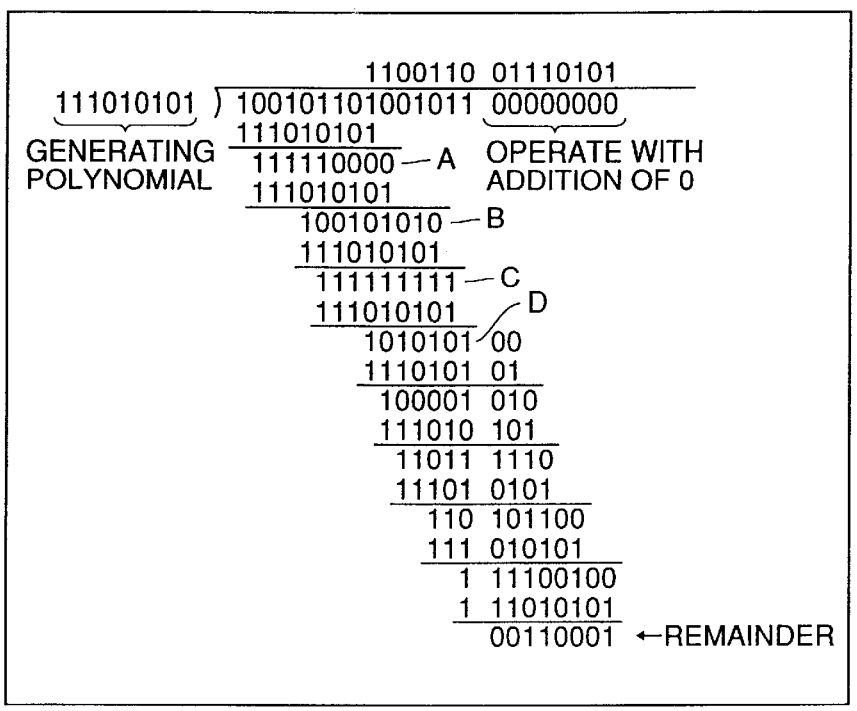
FIG. 15 is a diagram for illustrating mod2 division for obtaining a check bit from an information bit and a generating polynomial.
Figure 16:
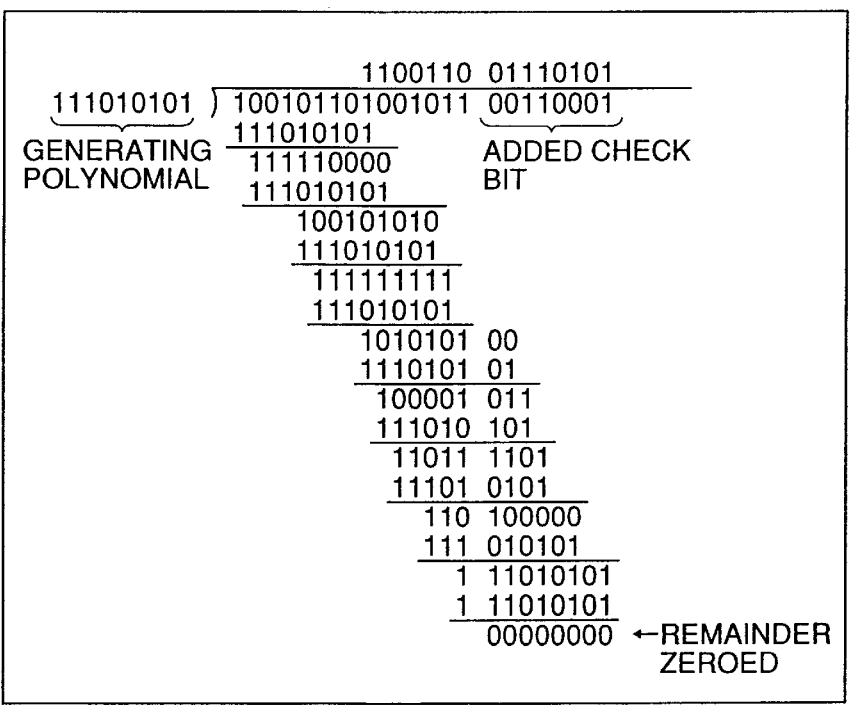
FIG. 16 is a diagram for illustrating an operation for confirming whether or not a transmission error occurs.

FIG. 14 is a circuit diagram showing the structure of an arithmetic circuit 66 employed in the CRC arithmetic unit according to the third embodiment.

Referring to FIG. 14, the arithmetic circuit 66 includes gate circuits 68#1 to 68#7 in place of the gate circuits 36#1 to 36#7 in the structure of the arithmetic circuit 36 shown in FIG. 1.

The gate circuit 68#1 is different in structure from the gate circuit 36#1 shown in FIG. 11 in a point that the same further includes a switching circuit 70#1 supplying either data $Xn^1$ or data $Xn^0$ to an XOR circuit 54#1. The gate circuit 68#2 is different in structure from the gate circuit 36#2 shown in FIG. 11 in a point that the same further includes a switching circuit 70#2 supplying either data $Xn^2$ or the data $Xn^0$ to an XOR circuit 54#2.

The gate circuit 68#3 is different in structure from the gate circuit 36#3 shown in FIG. 11 in a point that the same further includes a switching circuit 70#3 supplying either data $Xn^3$ or the data $Xn^0$ to an XOR circuit 54#3. The gate circuit 68#4 is different in structure from the gate circuit 36#4 shown in FIG. 11 in a point that the same further includes a switching circuit 70#4 supplying either data $Xn^4$ or the data $Xn^0$ to an XOR circuit 54#4.

The gate circuit 68#5 is different in structure from the gate circuit 36#5 shown in FIG. 11 in a point that the same further includes a switching circuit 70#5 supplying either data $Xn^5$ or the data $Xn^0$ to an XOR circuit 54#5. The gate circuit 68#6 is different in structure from the gate circuit 36#6 shown in FIG. 11 in a point that the same further includes a switching circuit 70#6 supplying either data $Xn^6$ or the data $Xn^0$ to an XOR circuit 54#6.

The gate circuit 68#7 is different in structure from the gate circuit 36#7 shown in FIG. 11 in a point that the same further includes a switching circuit 70#7 supplying either data $Xn^7$ or the data $Xn^0$ to an XOR circuit 54#7.

The remaining structures of the gate circuits 68#1 to 68#7 are similar to those of the gate circuits 36#1 to 36#7 respectively, and hence redundant description is not repeated.

The switching circuits 70#1 and 70#2 select the data $Xn^0$ and output the same to the XOR circuits 54#1 and 54#2 respectively in the example shown in FIG. 14. The switching circuits 70#3 to 70#7 select the data $Xn^3$ to $Xn^7$ respectively and output the same to the XOR circuits 54#3 to 54#7.

When employing the arithmetic circuit 66 shown in FIG. 14 in place of the arithmetic circuits 36 to 42 shown in FIG. 10, the degree of the generating polynomial can be changed by changing setting of the switching circuits 70#1 to 70#7. Further, the generating polynomial can be changed by changing setting of set data $S^7$ to $S^0$.

The switching circuits 70#1 to 70#7 may be switched by re-coupling wires, while gate circuits each selecting either one of two inputs with a selection signal, for example, may be employed.

As hereinabove described, the CRC arithmetic unit according to the third embodiment, capable of batch-processing multiple bits for attaining a high speed and changing the generating polynomial as well as the degree of the generating polynomial, can be flexibly employed for various systems.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A CRC arithmetic unit for performing error detection of a cyclic redundancy check system on object data on the basis of a generating polynomial, comprising:

a main arithmetic circuit sequentially receiving a plurality of split data obtained by splitting signal bits included in said object data into a plurality of bits for performing arithmetic processing according to said generating polynomial, said main arithmetic circuit performing said arithmetic processing on first data included in said plurality of split data and second data obtained by performing said arithmetic processing on part of said object data received before receiving said first data and generating third data; and a hold circuit supplying said second data to said main arithmetic circuit and thereafter holding said third data as said second data.

2. The CRC arithmetic unit according to claim 1, wherein said main arithmetic circuit includes:

a first sub-arithmetic circuit receiving fourth data obtained by affixing the most significant signal bit of said first data to the least significant side of said second data, and outputting the second most to the least significant signal bits of said fourth data as fifth data, when the most significant signal bit of said fourth data is of a first logical sign while outputting respective exclusive OR values of the second most to the least significant signal bits of said fourth data and signal bits of sixth data representing said generating polynomial as said fifth data, when the most significant signal bit of said fourth data is of a second logical sign different from said first logical sign, and a second sub-arithmetic circuit receiving seventh data obtained by affixing the second most significant signal bit of said first data to the least significant side of said fifth data, and outputting the second most to the least significant signal bits of said seventh data as eighth data, when the most significant signal bit of said seventh data is of said first logical sign while outputting respective exclusive OR values of the second most to the least significant signal bits of said seventh data and signal bits of said sixth data as said eighth data, when the most significant signal bit of said seventh data is of said second logical sign, and said main arithmetic circuit generates said third data in response to said eighth data.

3. The CRC arithmetic unit according to claim 2, wherein said first sub-arithmetic circuit includes:

a first gate circuit receiving a signal bit of said fourth data on a position corresponding to a signal bit matching with said second logical sign included in said sixth data and the most significant signal bit of said fourth data and outputting the exclusive OR.

4. The CRC arithmetic unit according to claim 3, wherein said first sub-arithmetic circuit further includes:

a second gate circuit outputting a signal bit of said fourth data on a position corresponding to a signal bit matching with said first logical sign included in said sixth data intact.

5. The CRC arithmetic unit according to claim 2, wherein said first sub-arithmetic circuit includes:

a plurality of gate circuits provided in correspondence to the second most to the least significant signal bits of said fourth data respectively, and each said gate circuit has:
- an AND circuit receiving the corresponding signal bit of said sixth data in one input and receiving the most significant signal bit of said fourth data in another input, and
- an XOR circuit receiving the corresponding signal bit of said fourth data and an output from said AND circuit and outputting the exclusive OR.

6. The CRC arithmetic unit according to claim 2, wherein said first sub-arithmetic circuit includes:
- a plurality of gate circuits provided in correspondence to the second least to the second most significant signal bits of said fourth data respectively, and
- each said gate circuit has:
  - an AND circuit receiving the corresponding signal bit of said sixth data in one input and receiving the most significant signal bit of said fourth data in another input,
  - a switching circuit receiving the corresponding signal bit of said fourth data and the least significant signal bit of said fourth data and selectively outputting either signal bit, and
  - an XOR circuit receiving outputs of said switching circuit and said AND circuit and outputting the exclusive OR.

7. The CRC arithmetic unit according to claim 2, wherein said first data includes:
- four signal bits, and
- said main arithmetic circuit further includes:
  - a third sub-arithmetic circuit receiving ninth data obtained by affixing the third most significant signal bit of said first data to the least significant side of said eighth data, and outputting the second most to the least significant signal bits of said ninth data as tenth data, when the most significant signal bit of said ninth data is of said first logical sign while outputting respective exclusive OR values of the second most to the least significant signal bits of said ninth data and signal bits of said sixth data as said tenth data, when the most significant signal bit of said ninth data is of said second logical sign, and
  - a fourth sub-arithmetic circuit receiving eleventh data obtained by affixing the least significant signal bit of said first data to the least significant side of said tenth data for outputting the second most to the least significant signal bits of said eleventh data as said third data, when the most significant signal bit of said eleventh data is of said first logical sign while outputting respective exclusive OR values of second most to the least significant signal bits of said eleventh data and signal bits of said sixth data as said third data, when the most significant signal bit of said eleventh data is of said second logical sign.

8. The CRC arithmetic unit according to claim 7, wherein said main arithmetic circuit receives, if a remainder, which is not zero, results when dividing the number of signal bits of said object data by 4, the plurality of split data further obtained by supplementing one or more bits having the first logical sign to the object data by a number equal to 4 minus the remainder.

9. The CRC arithmetic unit according to claim 1, wherein said hold circuit includes:
- a plurality of registers receiving a plurality of signal bits included in said third data in inputs respectively and holding said plurality of signal bits in response to a clock signal.

* * * * *